United States Patent
Bergman et al.

(10) Patent No.: US 6,357,142 B1
(45) Date of Patent: Mar. 19, 2002

(54) METHOD AND APPARATUS FOR HIGH-PRESSURE WAFER PROCESSING AND DRYING

(75) Inventors: Eric J. Bergman; Ian Sharp; Craig P. Meuchel; H. Frederick Woods, all of Kalispell, MT (US)

(73) Assignee: Semitool, Inc., Kalispell, MO (US)

( * ) Notice: Subject to any disclaimer, the term of this patent is extended or adjusted under 35 U.S.C. 154(b) by 0 days.

(21) Appl. No.: 09/924,999

(22) Filed: Aug. 7, 2001

Related U.S. Application Data

(63) Continuation of application No. 09/481,651, filed on Jan. 12, 2000, now Pat. No. 6,286,231.

(51) Int. Cl.[7] .................................................. F26B 5/04
(52) U.S. Cl. ............................ 34/410; 34/340; 34/351; 34/401; 34/471; 34/493; 34/497; 34/558; 34/210; 134/1.3; 134/22.18; 134/155
(58) Field of Search .......................... 34/255, 279, 340, 34/348, 351, 357, 401, 402, 405, 410, 448, 471, 493, 480, 497, 558, 634, 638, 210, 212, 417; 134/1.3, 21, 22.18, 95.2, 155, 186

(56) References Cited

U.S. PATENT DOCUMENTS

| | | |
|---|---|---|
| 4,695,327 A | 9/1987 | Grebinski |
| 5,879,464 A | 3/1999 | Denzler et al. |
| 5,951,779 A | 9/1999 | Koyanagi et al. |
| 5,966,631 A | 10/1999 | Gale et al. |
| 5,974,689 A | 11/1999 | Ferrell et al. |
| 6,090,217 A | 7/2000 | Kittle |
| 6,143,087 A | 11/2000 | Walter |
| 6,158,447 A * | 12/2000 | Kamikawa et al. ....... 134/56 R |
| 6,161,300 A | 12/2000 | Kim |
| 6,216,709 B1 * | 4/2001 | Fung et al. ................. 134/25.4 |
| 6,227,212 B1 * | 5/2001 | Konishi et al. .............. 134/1.3 |

* cited by examiner

Primary Examiner—Pamela Wilson
(74) Attorney, Agent, or Firm—Lyon & Lyon LLP

(57) ABSTRACT

A system for high-pressure drying of semiconductor wafers includes the insertion of a wafer into an open vessel, the immersion of the wafer in a liquid, pressure-sealing of the vessel, pressurization of the vessel with an inert gas, and then the controlled draining of the liquid using a moveable drain that extracts water from a depth maintained just below the gas-liquid interface. Thereafter, the pressure may be reduced in the vessel and the dry and clean wafer may be removed. The high pressure suppresses the boiling point of liquids, thus allowing higher temperatures to be used to optimize reactivity. Megasonic waves are used with pressurized fluid to enhance cleaning performance. Supercritical substances are provided in a sealed vessel containing a wafer to promote cleaning and other treatment.

53 Claims, 9 Drawing Sheets

DRYING SYSTEM

Fig. 4 PROCESSING SYSTEM

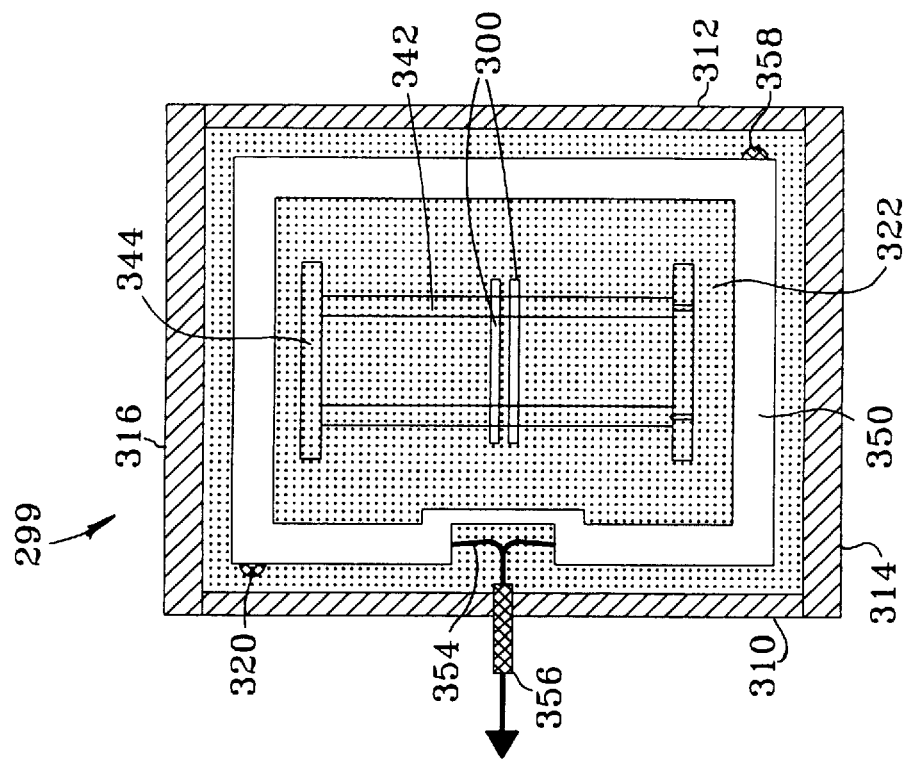
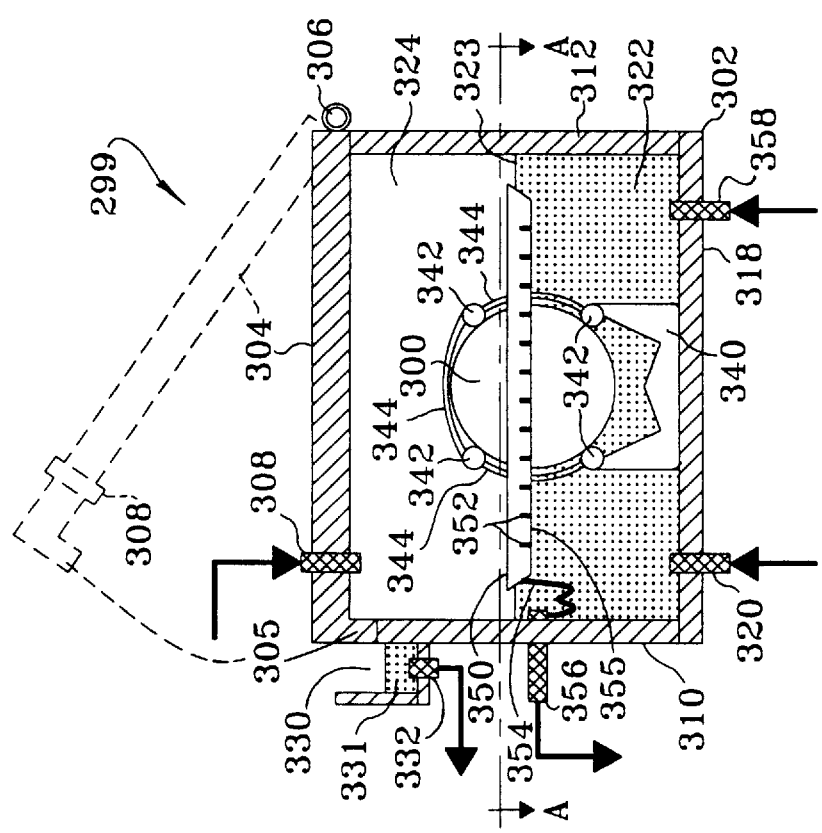
Fig. 7A
Fig. 7B

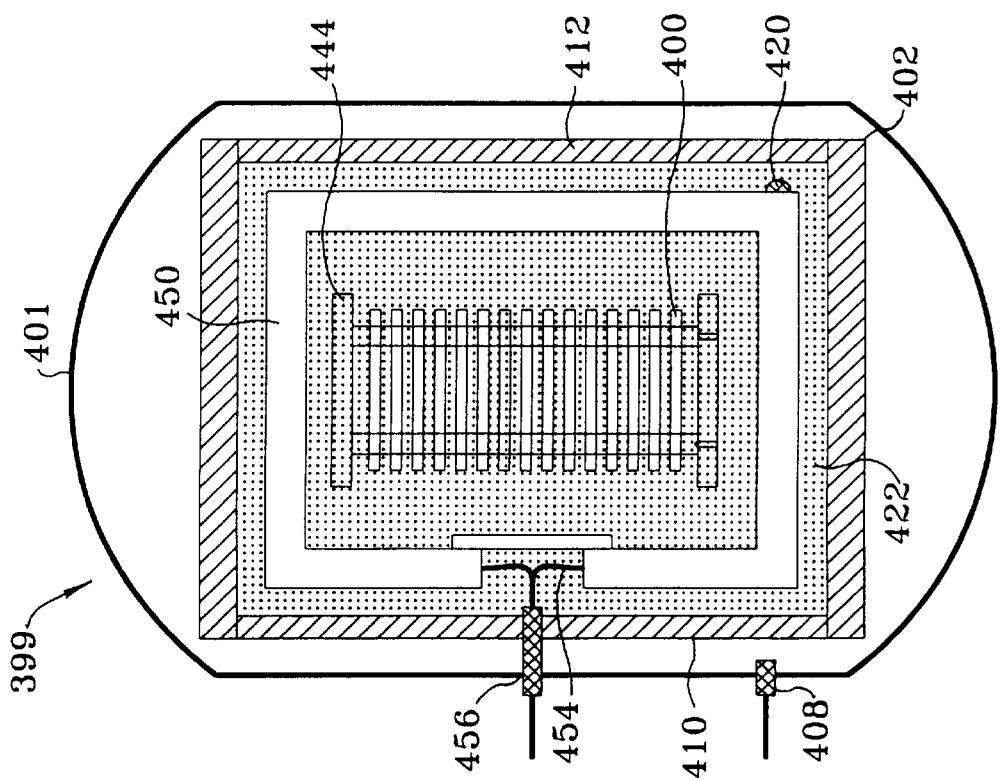
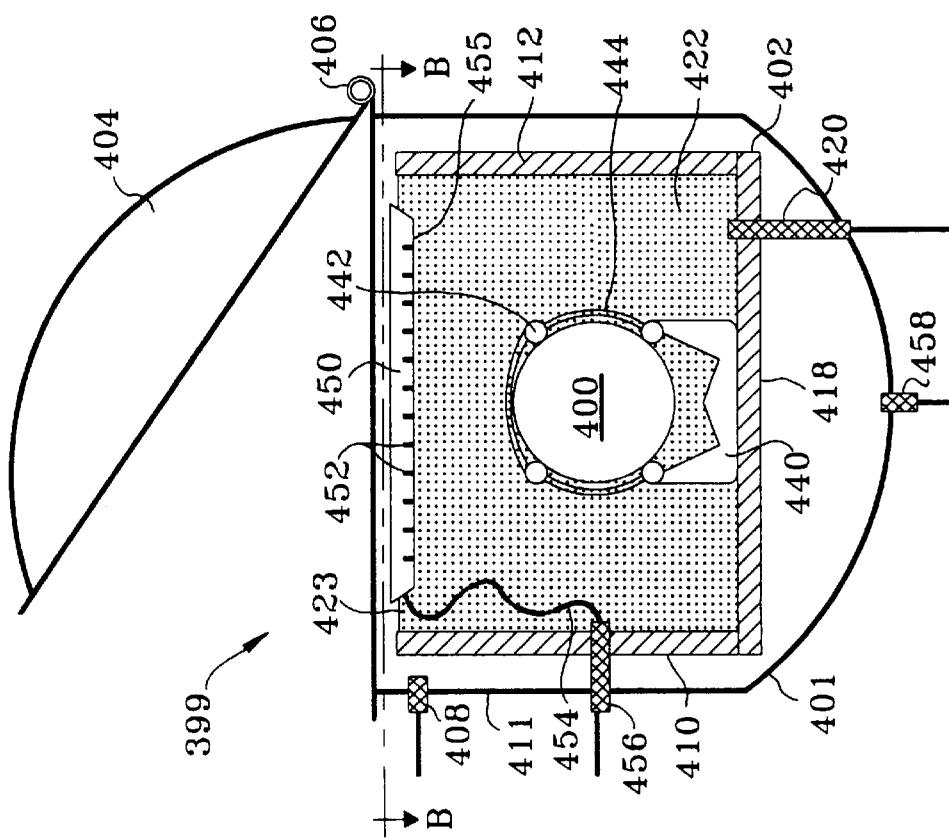
Fig. 8B
Fig. 8A

METHOD AND APPARATUS FOR HIGH-PRESSURE WAFER PROCESSING AND DRYING

This application is a continuation of application Ser. No. 09/481,651, filed Jan. 12, 2000 and now U.S. Pat. No. 6,286,231.

FIELD OF THE INVENTION

The present invention relates to the processing and drying of semiconductor wafers or similar items at high pressures.

BACKGROUND OF THE INVENTION

Wet chemical processes are a crucial part of semiconductor device fabrication. Such processes include etching of films, removal of photoresist, and surface cleaning. Over the years, specific applications have spawned the development of numerous chemistries for wet processing, including APM (a mixture of ammonium hydroxide, hydrogen peroxide, and water), HPM (hydrochloric acid, hydrogen peroxide, and water); SPM (sulfuric acid and hydrogen peroxide), SOM (sulfuric acid and ozone), and others for specific cleaning or etching tasks. Many of these chemistries are used at or near their boiling points, since chemical reactivity, and therefore the effectiveness of the cleaning, is a function of temperature. Recent developments in wet processing technology have incorporated the use of various gases with aqueous or other liquid solutions to accomplish a desired process objective. For example, the use of ozone and water creates a strong oxidizing solution that may be useful in semiconductor processing. The use of hydrochloric acid or ammonia gas injected into water to create a low or high pH solution with specific properties are additional examples of the use of gas technology.

The use of gas/liquid process mixtures is often limited by gas solubility and temperature constraints. Solubility limitations are heightened when aqueous solutions are used. The limited solubility of gases such as ozone in water at ambient conditions, for example, limits the effectiveness of ozone/water solutions for oxidizing organic compounds, as there is simply not enough ozone available to promote the oxidation process. Reactivity constraints related to temperature are often intertwined with solubility limitations. For example, the solubility of virtually all gases in liquid solution decreases with increases in temperature. Chemical reactivity, however, increases with increasing temperature. These two factors are in conflict with each other for process optimization. Additionally, many of the aqueous solutions used in semiconductor processing are limited by their boiling points. One reason it is desirable to avoid boiling is to prevent cavitation and suppress bubble formation for more effective use of megasonic waves in cleaning wafer surfaces. For example, a 5:1:1 mixture of water, ammonium hydroxide, and hydrogen peroxide will boil at approximately 65 C. Accordingly, such a mixture cannot be maintained in liquid form at elevated temperature unless the composition is changed to elevate the boiling point.

A critical step in the wet-processing of semiconductor device wafers is the drying of the wafers. Any rinsing fluid that remains on the surface of a semiconductor wafer has at least some potential for depositing residue or contaminants that may interfere with subsequent operations or cause defects in the end product electronic device. In practice, deionized ("DI") water is most frequently used as the rinsing fluid. Like most other liquids, DI water will "cling" to wafer surfaces in sheets or droplets due to surface tension following rinsing. An ideal drying process would operate quickly to effect the removal of these sheets or droplets and leave absolutely no contaminants on the wafer surfaces, while presenting no environmental or safety risks.

Although various technologies have been used to dry wafers and reduce the level of contaminants left on the wafer surface after drying, the most attractive technology currently available falls under the broad category of surface tension trying. A typical surface tension dryers accomplishes wafer drying using the following steps: (1) wafers are immersed in a rinse medium; (2) the rinse medium is either drained away from the wafers or the wafers are lifted out of the rinse medium, exposing them to a displacement medium that is typically an inert carrier gas containing a percentage of organic vapor, usually an alcohol, such as isopropyl alcohol ("IPA"); (3) the organic vapor dissolves in the surface film of the rinse medium, creating a concentration gradient in the liquid, which in turn creates a surface tension gradient that enables the higher surface tension in the bulk liquid to essentially "pull" the lower surface tension liquid away from the wafer surface along with any entrained contaminants to yield a dry wafer; and, in some instances, (4) the displacement medium may be purged from the locale of the wafer using a drying medium such as an inert gas stream. Additionally, the carrier gas may be heated to assist in drying and to prevent liquid condensate from forming on the wafer surfaces.

Conventional surface tension drying technology is limited by at least the following factors: (1) it involves the inherent hazard of causing IPA, a flammable liquid, to be boiled at a temperature well in excess of its flash point; (2) it requires the consumption of IPA at relatively high rate; and (3) it creates relatively high fugitive organic vapor emissions.

In light of the limitations inherent to these and other processing and drying technologies, it is an object of one aspect of the present invention to suppress the boiling point of a wafer processing liquid to permit processing at elevated temperatures.

It is an object of another aspect of the present invention to increase the solubility of gases in the liquid phase to enhance chemical reactivity.

It is yet another object of the present invention to prevent cavitation and suppress bubble formation for more effective use of megasonic waves to enhance cleaning performance.

It is still another object of the present invention to reduce or eliminate the need for using an organic vapor as a drying or displacement medium in a wafer drying process.

The term "wafer" means a semiconductor wafer, or similar flat media such as photomasks, optical, glass, and magnetic disks, flat panels, etc.

SUMMARY OF THE INVENTION

To these ends, in a first aspect of the invention, a method of drying a wafer includes placing a wafer into a vessel, immersing the wafer in a liquid, pressure-sealing the vessel, pressurizing the vessel, and then controlling removal of the liquid. Thereafter, the pressure may be reduced in the vessel and the dry and clean wafer may be removed.

The drying process operates at a pressure preferably between 10 and 100 atmospheres, and more preferably, between 20 and 50 atmospheres. The gas delivered to the vessel is advantageously also temperature controlled. The high pressure promotes the dissolution of gas into the liquid, generating a concentration gradient and a related surface tension gradient. As the liquid along the surface is drained away to expose fresh liquid to the gas, the gas preferably continues to be supplied to maintain the surface tension gradient. The surface tension gradient pulls liquid from the surface of the wafer as the liquid level descends, yielding a clean, dry wafer.

In second aspect of the invention, in a method for processing a wafer, high pressure is used to raise the liquid boiling point allowing processing at higher temperatures, to increase reactivity. The method may advantageously use a variety of liquids and gases to achieve specific objectives.

In a third aspect of the invention, megasonic waves are used in conjunction with pressurized fluid to yield enhanced cleaning performance with higher efficiency.

In a fourth aspect of the invention, supercritical substances are provided in a sealed vessel containing a wafer to promote cleaning and other treatment.

In a fifth aspect of the invention, an apparatus for processing wafers at high pressures is provided. Preferably, the apparatus includes a pressure sealable vessel, a floating or hinged moveable drain within the vessel, and orifices for adding liquid and gas to the vessel.

In a sixth aspect of the invention, phase changes between liquid phase and critical phase are used to process a wafer.

BRIEF DESCRIPTION OF THE DRAWINGS

Other objects and features of the present invention will become apparent from the following detailed description and drawings, which disclose embodiments of the invention. It should be understood, however, that the drawings are designed for the purpose of illustration only and are not intended as a definition of the limits of the invention.

In the drawings, where the same reference characters denote the same elements, throughout the several views:

FIG. 7A is a schematic, cross-sectional, side view of a wafer processing apparatus of the present invention;

FIG. 7B is a schematic, cross-sectional, plan view of the apparatus of FIG. 7A along section line "A—A" in FIG. 7A;

FIG. 8A is a schematic, cross-sectional, side view of a first alternative wafer processing apparatus of the present invention;

FIG. 8B is a schematic, cross-sectional, plan view of the apparatus of FIG. 8A along section line "B—B" in FIG. 8A;

DETAILED DESCRIPTION OF THE PREFERRED EMBODIMENTS

Figure 1:
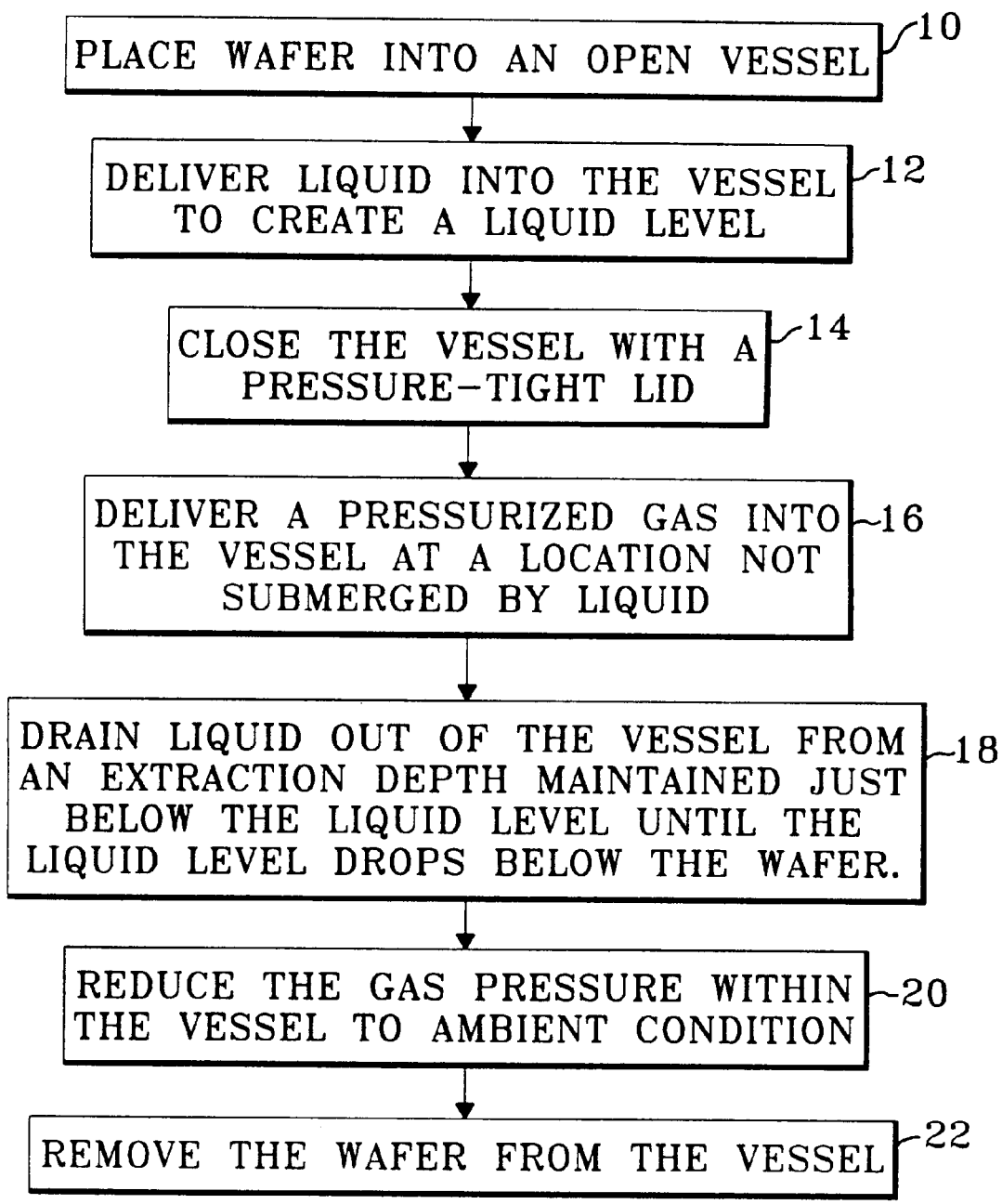
FIG. 1 is a flow diagram illustrating a high pressure wafer drying.

FIG. 1 illustrates the basic steps of a high pressure wafer drying method in accordance with one aspect of the present invention.

Referring now in detail to FIG. 1, a wafer or batch of wafers is placed into a vessel, as represented by step 10. Liquid is delivered into the vessel to create a liquid level, as represented by step 12. Deionized water is a preferred process liquid, since it is inexpensive, non-reactive with the wafer material, and presents no vapor emission problems. Other liquids, including water-based mixtures, may be used instead. Preferably the liquid immerses the wafer completely so that the liquid level is above the highest point of the wafer. Further, the liquid level preferably overflows at least one wall of the vessel so as to flush away any contaminants from inside the vessel or from the surface of the wafer. The vessel is then closed with a pressure-tight lid to contain elevated pressures within the vessel, as represented by step 14.

Once the vessel is closed and pressure-sealed, pressurized gas is delivered into the vessel through an orifice located high enough in the vessel so that it is not submerged by the liquid within the vessel, as represented by step 16. The gas preferably is inert with significant solubility in the liquid. Carbon dioxide or argon are examples of gases that may be advantageously used with deionized water within the vessel, since these inert gases have relatively high solubility in water. The continued delivery of pressurized gas into the sealed vessel elevates the pressure within the vessel. Since the solubility of virtually all gases in liquids increases with pressure, the elevated pressure within the vessel increases the dissolved gas concentration at the surface of the liquid. This creates a surface tension gradient.

As represented by step 18, the liquid then starts to be drained out of the vessel, such as by the opening of a throttle valve. The draining occurs via the elevated pressure within the vessel forcing the liquid through the valve to a lower pressure region. As further represented by step 18, it is important to perform this draining from an extraction depth maintained just below the liquid level within the vessel. This is important for two reasons. The exit point just below the liquid surface allows the surface film to be constantly drained off, resulting in a fresh layer for the gas to dissolve into, thereby replenishing the surface tension gradient. In addition, the slightly submerged exit point seals the gas from venting directly out of the vessel. The gas is prevented from escaping through the path of least resistance, thereby increasing the amount of gas which dissolves into the liquid surface.

The delivery rate of gas to the vessel must be adequate to create a reasonable liquid drain rate. The preferred operating pressure range is between 10 and 100 atmospheres, more preferably between 20 and 50 atmospheres. At these operating pressures, a flow rate of between 1 and 10 liters per minute is adequate to provide a sufficient surface tension gradient at the liquid-gas interface within a 40 liter pressurized process vessel. In addition to the gradient at the top surface of the bulk liquid, there is also a horizontal gradient across the top surface resulting from the draining off of liquid from the sides.

As the liquid drains, the level within the vessel drops and the surface tension gradient pulls the liquid from the wafer surface. This draining continues until the liquid level drops completely below the dried wafer. As represented in step 20, the pressure within the vessel is reduced to ambient conditions, such as by reducing gas delivery to the vessel. Then, the vessel can be opened and the dry wafer removed, as represented in step 22.

The gas delivery orifice is located so that it is not submerged by the liquid, as represented in step 16. This prevents the injection of gas into the liquid, which could cause bubbling or droplet carryover. Bubbles within the liquid are detrimental to the performance of the drying process, since such bubbles bursting near the wafer surface could cause water spots on any portion of the wafer surface previously dried, and cause contaminants to adhere to the wafer surface.

Figure 2:
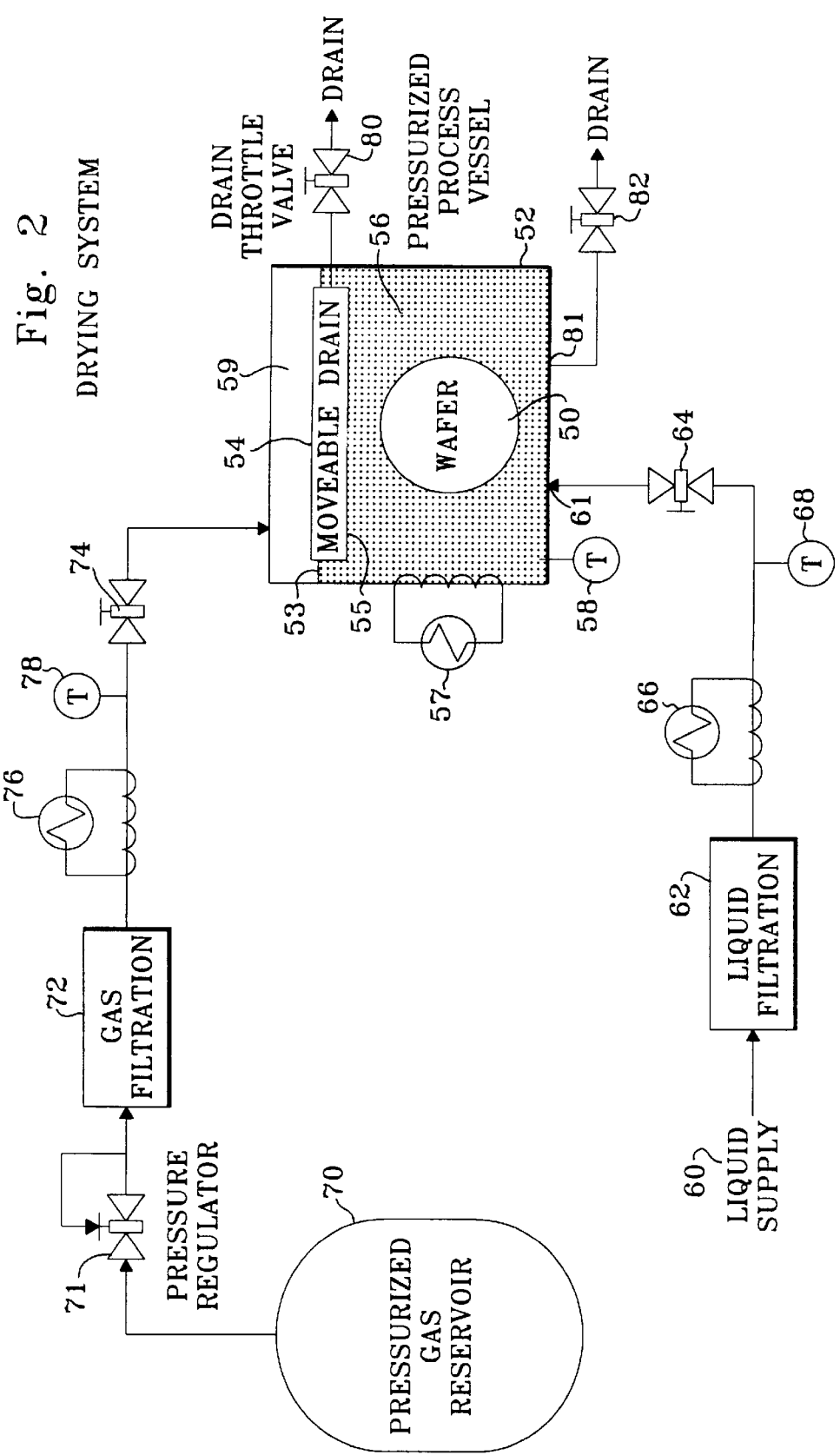
FIG. 2 is a schematic drawing of a high pressure wafer drying system for performing the drying process shown in FIG. 1.

FIG. 2 is a schematic diagram of a high pressure wafer drying system for carrying out the drying steps illustrated in FIG. 1. At least one wafer 50 is placed within a process vessel 52 suitable for containing elevated pressures. The process vessel 52, which is preferably emptied of any liquid before the wafer 50 is placed inside so as to flush away any contaminants, is then closed around the wafer 50. The process vessel 52 preferably contains a moveable drain 54 that maintains a extraction depth just below the liquid-gas interface 53 within the vessel 52, such as by floating on the surface of the liquid 56 within the vessel 52 and draining liquid 56 from the bottom 55 of the moveable drain 54. Once the process vessel 52 is closed, a liquid supply valve 64 opens to allow liquid to flow from a liquid supply 60, through a liquid filter 62, and into the vessel 52. The liquid supplied to the vessel 52 may be optionally temperature controlled by a liquid supply heat exchanger 66 and a liquid supply temperature sensor 68 located downstream of the liquid supply heat exchanger 66. Similarly, the vessel itself may be optionally temperature controlled with a vessel heat exchanger 57 and a liquid temperature sensor 68 measuring either the wall temperature of the vessel 52, or, preferably, the temperature of the liquid 56 within the vessel 52. The liquid 56 continues to flow into the vessel 52 until the wafer 50 is completely immersed. The liquid inlet 61 is preferably at or near the bottom of the vessel.

Pressurized gas is then delivered to the vessel 52 by opening of a gas supply valve 74, which allows gas to flow from a pressurized gas supply 70, through a pressure regulator 71 and a gas filter 72, and into the vessel 52. The gas 59 supplied to the vessel 52 may be optionally temperature controlled by a gas supply heat exchanger 76 and a gas temperature sensor 78 located downstream of the gas supply heat exchanger 76. Delivery of the gas 59 into the vessel 52 pressurizes the vessel 52, thereby increasing the concentration of gas 59 dissolved into the liquid 56 at the gas-liquid interface 53, creating a surface tension gradient. Gas 59 flows into the vessel until an operating pressure preferably between 10 and 100 atmospheres, more preferably between 20 and 50 atmospheres, is attained.

Once the operating pressure is reached within the vessel 52, the liquid throttle valve 80 is opened to allow liquid 56 to begin draining out of the vessel 52 through the moveable drain 54. Liquid 56 is drawn into the moveable drain 54 from below to maintain the surface tension gradient along the gas-liquid interface 53, and to prevent the gas from escaping before dissolving into the liquid. The flow of liquid 56 through the liquid drain valve 80 is driven by the elevated pressure within the vessel 52. The gas 59 preferably continues to flow into the vessel 52 through gas supply valve 74 while the liquid 56 is being drained.

As the liquid 56 is drained, the gas-liquid interface 53 descends within the vessel 52. The wafer 50 is dried as the surface tension gradient pulls the liquid from the surface of the wafer 50 as the wafer 50 is exposed to the gas 59. This draining continues until the liquid level drops completely below the dried wafer 50. Once the wafer 50 is dried, the pressure within the vessel 52 may be reduced to ambient, by reducing delivery of gas 59 to the vessel 52. The vessel 52 may then be opened and the dry wafer 50 removed. Any additional liquid 56 present within the vessel 52 may be removed via a gravity drain 81 by opening a gravity drain valve 82 along the bottom of the vessel 52 in preparation for the drying of additional wafers.

Figure 3:
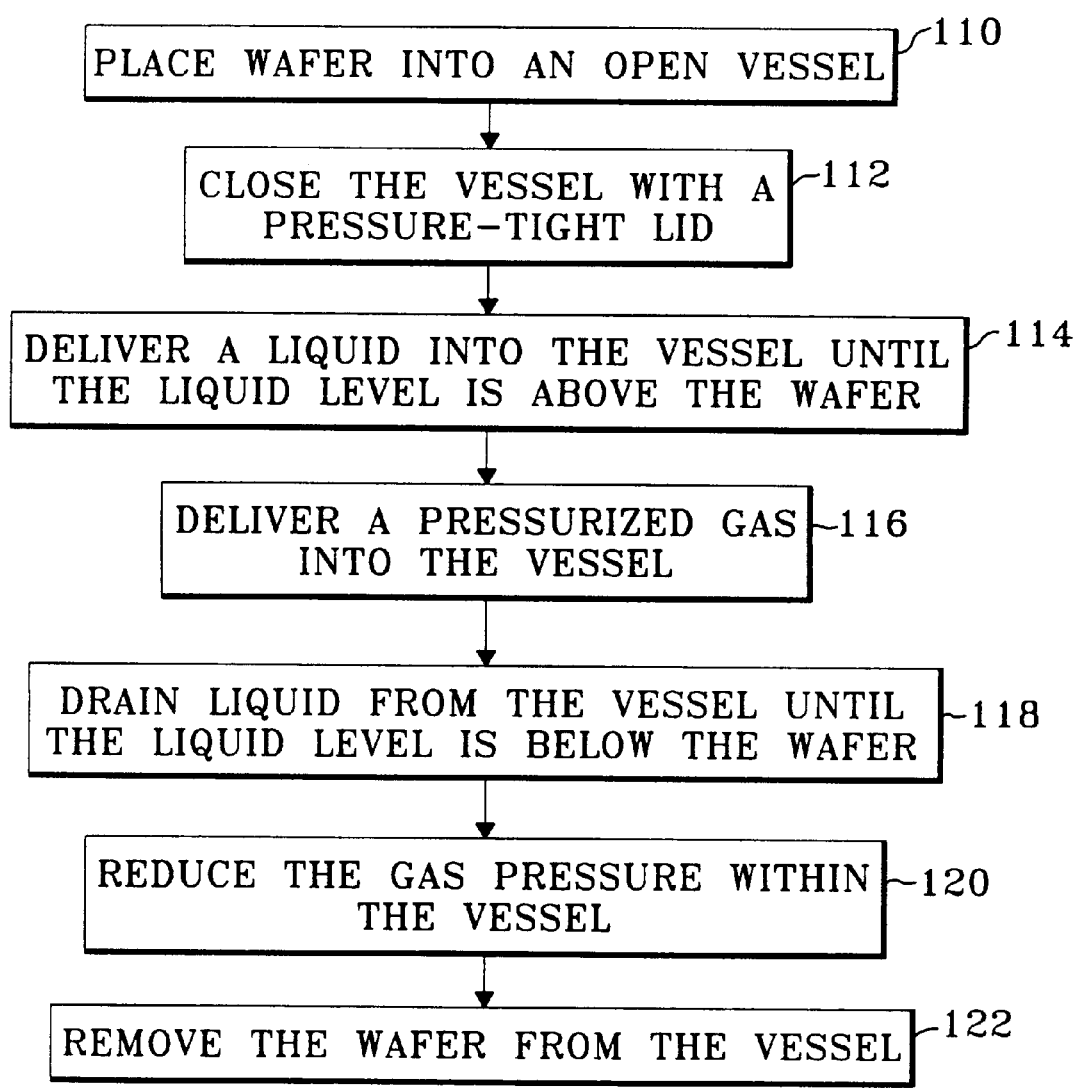
FIG. 3 is a flow diagram illustrating a high pressure wafer processing method.

FIG. 3 illustrates the basic steps of a high pressure semiconductor wafer processing method. While the term "processing" here may include wafer drying, it also includes etching, cleaning, rinsing, and other treatment steps.

Referring now in detail to FIG. 3, at least one wafer is placed into an open vessel, as represented by step 110. The vessel is then closed with a pressure-tight lid or door, to contain elevated pressures within the vessel, as represented by step 112. Following the sealing of the vessel, a liquid is delivered into the vessel until the wafer is immersed, so that the liquid level is above the wafer, as represented by step 114. This liquid may or may not be reactive with the wafer material, depending on the desired processing result. Upon immersion of the wafer, a pressurized gas is delivered into the vessel, as represented by step 116. The particular gas to be used, as well as whether the gas is delivered above the liquid or injected directly into the liquid, depends on the particular chemical process desired. Gases such as carbon dioxide, argon, fluouromethane, and trifluoromethane may be used if an inert gas is desired, such as where the processing will include a final drying step. If the gas is to be used for drying, then it is important not to inject the gas into the liquid, to avoid bubbling and liquid carryover. If a reactive gas is desired, then a variety of gases including ozone, HCl, HF, or gaseous ammonia may be used. Operation at elevated pressures allows the gas to become dissolved in the liquid at elevated concentration levels.

The liquid may then be drained from the vessel until the liquid level is below the wafer, as represented by step 118. If it is not desirable or necessary to maintain a high dissolved gas concentration at the surface of the liquid, then the liquid may be drained from a fixed drain along the bottom of the vessel. But where it is desirable to treat the surface of the wafer with a liquid having a high concentration of dissolved gas, such as in instances where wafer drying is desirable, then the liquid may be drained from the vessel by way of a moveable drain positioned along the gas-liquid interface within the vessel. The steps of immersing the wafer with liquid, pressurizing the vessel with gas, and then draining away the liquid, may be repeated and performed sequentially with different gases and liquids to accomplish several processing objectives within the same vessel. Typically, the final wet processing step includes immersion in deionized water and drying with an inert gas. Once the desired processing is complete, the gas pressure within the vessel is reduced, such as by reducing the flow of gas into the vessel, as represented by step 120. At that time, the vessel may be opened and the wafer removed, as represented by step 122.

Among the benefits of wet processing wafers at high pressures is the ability to safely sustain chemical treatment at high temperatures without approaching the boiling point of the underlying liquid. This is particularly important where volatile and/or flammable liquids are being used. Using the processing methods of the present invention, large amounts of thermal energy can be made available to support reactions that were heretofore either too dangerous or too slow to be feasible for commercial wafer processing. Moreover, processing under pressure conditions may also allow for a transition from a wetted state to a dry state under a gas blanket such as carbon dioxide.

Figure 4:
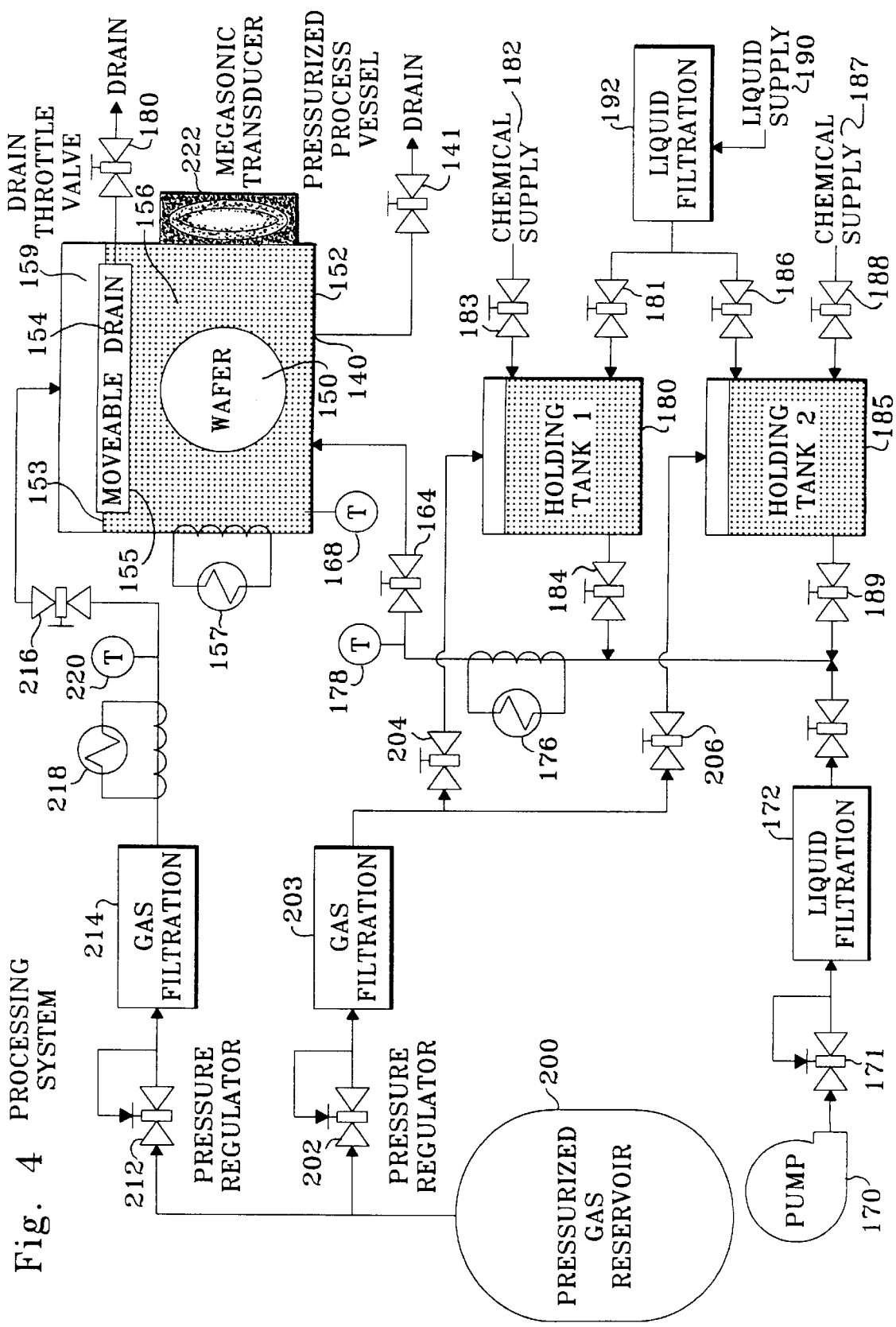
FIG. 4 is a schematic drawing of a high pressure wafer processing system for carrying out the processing steps shown in FIG. 3.

FIG. 4 is a schematic diagram of a high pressure wafer processing system which may be used to carry out the steps illustrated in FIG. 3. At least one wafer 150 is placed within a process vessel 152 suitable for containing elevated pressures. The process vessel 152, which is preferably emptied of any liquid before the wafer 150 is placed inside so as to flush away any contaminants, is then closed around the wafer 150. The process vessel 152 preferably contains a moveable drain 154 that maintains a extraction depth just below the liquid-gas interface 153 within the vessel 152, such as by floating on the surface of the liquid 156 within the vessel 152 and draining liquid 156 from the bottom 155 of the moveable drain 154. A moveable drain 154 is preferred where it is desirable to treat or dry the surface of the wafer 150 with a liquid having a high concentration of dissolved gas. A gravity drain 140 and gravity drain valve 141 are preferably also provided to drain any liquid 156 remaining within the vessel 152 following the processing of one wafer 150 to prepare for another.

Once the process vessel 152 is closed around the wafer 150, a liquid supply valve 164 opens to allow liquid to flow from at least one source into the vessel 152. The liquid 156 continues to flow into the vessel 152 until the wafer 150 is completely immersed. Liquid may be supplied via a liquid supply pump 170 through a pressure regulator 171 and a liquid supply filter 172. Preferably, however, liquid may be supplied via one or more holding tanks 180, 185. Multiple holding tanks are desirable to accomplish delivery from one holding vessel to the process vessel 152 while the other vessel is vented and re-filled with liquid. This continuous liquid delivery to the process vessel 152 may be accomplished without the need for venting to atmosphere or utilizing high-pressure pumps with corresponding sealing and/or contamination problems. The holding tanks 180, 185 are furnished with liquid such as water from a liquid supply 190 by way of a liquid filter 192 and liquid supply valves 181, 186. Chemicals may be injected into the holding tanks 180, 185 from chemical supplies 182, 187 through chemical supply valves 183, 188 to yield mixtures such as APM, HPM, SPM, SOM, or numerous other chemistries known in semiconductor processing. The holding tanks 180, 185 may be pressurized with gas supplied from a pressurized gas reservoir 200 through a pressure regulator 202, gas filter 203, and supply valves 204, 206. Once pressurized, the liquid may flow from holding tanks 180, 185 to the vessel 152 by way of tank outlet valves 184, 189. The liquid supplied to the vessel 152 by whatever source may be optionally temperature controlled by way of a liquid supply heat exchanger 176 and a liquid temperature sensor 178 located downstream of the liquid supply heat exchanger 176. Moreover, the vessel itself may be optionally temperature controlled by way of a vessel heat exchanger 157 and a liquid temperature sensor 168 measuring either the wall temperature of the vessel 152 or, preferably, the temperature of the liquid 156 within the vessel 152.

Upon immersion of the wafer 150, pressurized gas is delivered into the vessel 152. Gases such as carbon dioxide, argon, fluouromethane, and trifluoromethane may be used if an inert gas is desired, such as where the processing will include a final drying step. Whether the gas is delivered above the liquid or injected directly into the liquid depends on the particular chemical process desired.

However, if the gas is to be used for drying, then it is preferred not to inject the gas into the liquid. If a reactive gas is desired, then a variety of gases including ozone, HCl, or gaseous ammonia may be advantageously used. A reactive gas, however, is not desired for use in pressurizing holding tanks 180, 185. In cases where holding tanks are used to deliver liquid to the vessel 152, and reactive gases are used in the vessel 152, then a separate inert pressurized gas supply (not shown) should be maintained for pressurizing the holding tanks. Gas 159 is supplied to the vessel 152 from a pressurized gas reservoir 200 through a gas pressure regulator 212, a gas filter 213, and a gas supply valve 216. The gas 159 supplied to the vessel 152 may be optionally temperature controlled by way of a gas supply heat exchanger 218 and a gas temperature sensor 220 located downstream of the gas supply heat exchanger 218. Heating the gas may reduce the surface tension of the liquid 156 within the vessel when the gas 159 becomes dissolved in the liquid 156.

The operating pressure within the vessel is preferably maintained between 10 and 100 atmospheres, more preferably between 20 and 50 atmospheres. Flow rates of gas between 1–10liters per minute at operating pressure are preferred for a vessel size of approximately 40 liters. While the wafer 150 is immersed in liquid 156 within the chamber, an optional megasonic transducer 222 within the vessel 152 may be used to assist in cleaning the wafer 150 with sound waves. The pressurized liquid prevents cavitation and suppresses bubble formation for more effective use of megasonics to enhance cleaning performance by minimizing power dissipation and increasing acoustic streaming. Once the pressure inside the vessel 152 attains operating levels, the liquid 156 may be drained from the vessel. If it is not desirable or necessary to maintain a high concentration of dissolved gas 159 at the surface of the liquid 156, then the liquid 156 may be drained from a fixed gravity drain 140 along the bottom of the vessel. But where it is desirable to treat the surface of the wafer 150 with a liquid having a high concentration of dissolved gas, such as in instances where wafer drying is desirable, then the liquid 156 may be drained from the vessel 152 by way of a moveable drain 154 positioned along the gas-liquid interface 153 within the vessel 152. Liquid 56 is drawn into the underside 155 of the moveable drain 154 so as to maintain the gas concentration and surface tension gradient along the gas-liquid interface 153 by allowing the surface film to be constantly being drained away, and to prevent the gas 159 from escaping before dissolving into the liquid 156. The flow of liquid 156 through the drain throttle valve 180 is induced by the elevated pressure within the vessel 152, and gas 159 preferably continues to flow into the vessel 152 through gas supply valve 174 while the liquid 156 is being drained.

The steps of immersing the wafer 150 with liquid 156, pressurizing the vessel 152 with gas 159, then draining away the liquid 156 may be repeated and/or performed sequentially with different gases and liquids to accomplish several processing objectives within the same vessel. Cycling, that is, repeatedly elevating and decreasing, the pressure within the vessel 152 may assist in promoting the introduction of process fluids into complex wafer geometries. Once the desired processing is complete, the gas pressure within the vessel is reduced, such as by reducing the flow of gas 159 into the vessel 152. At that time, the vessel 152 may be opened and the wafer 150 removed.

Figure 5:
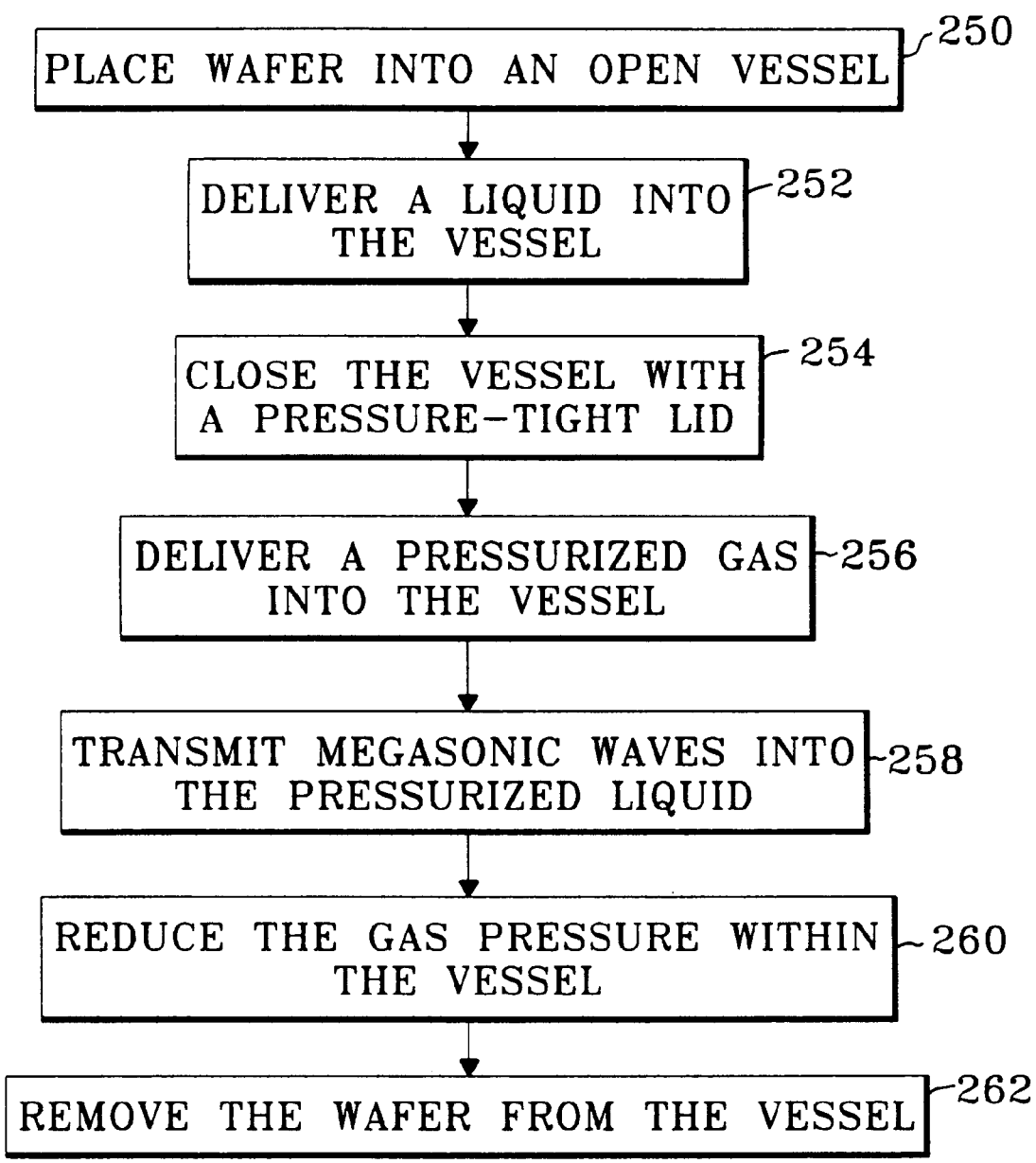
FIG. 5 is a flow diagram illustrating a high pressure megasonic wafer processing.

FIG. 5 illustrates the basic steps of a high pressure semiconductor wafer processing method, specifically including a megasonic cleaning step. This method may also be performed with equipment illustrated in FIG. 4. A wafer is placed into an open vessel, as represented in step 250. A liquid, such as deionized water, for example, is delivered into the vessel to immerse the wafer, as represented in step 252. Preferably, before the vessel is closed, the liquid delivered into the vessel overflows at least one wall of the vessel to flush any loose contaminants that may have been resident in the vessel or on the surface of the wafer before further processing. The vessel is then closed with a pressure-tight lid, as represented in step 254. Following the sealing of the vessel, the vessel is pressurized by the delivery of a pressurized gas into the vessel, as represented in step 256.

Once the wafer is immersed in pressurized liquid, megasonic waves may be transmitted into the liquid and against the wafer for maximum advantage, as represented in step 258. The megasonic transducer 222 on the vessel, shown in FIG. 4, provides the megasonic waves. As compared to liquids at atmospheric pressure, the pressurized liquid prevents cavitation and suppresses bubble formation for more effective use of megasonics to enhance cleaning performance by minimizing power dissipation and increasing acoustic streaming. Following the delivery of megasonic waves into the vessel, the wafer may be optionally rinsed and dried or simply dried, with drying being accomplished by draining pressurized liquid from the vessel with a moveable drain positioned along the gas-liquid interface within the vessel. As the liquid is being drained, the gas-liquid interface descends within the vessel, and the wafer is dried as the surface tension gradient pulls the liquid from the surface of the wafer as the wafer is gradually emerges from the receding liquid. As represented in step 260, the gas pressure is then reduced within the vessel, such as by reducing the pressurized gas supply to the vessel, and finally the vessel may be opened to permit the wafer to be removed, as represented in step 262.

Figure 6:
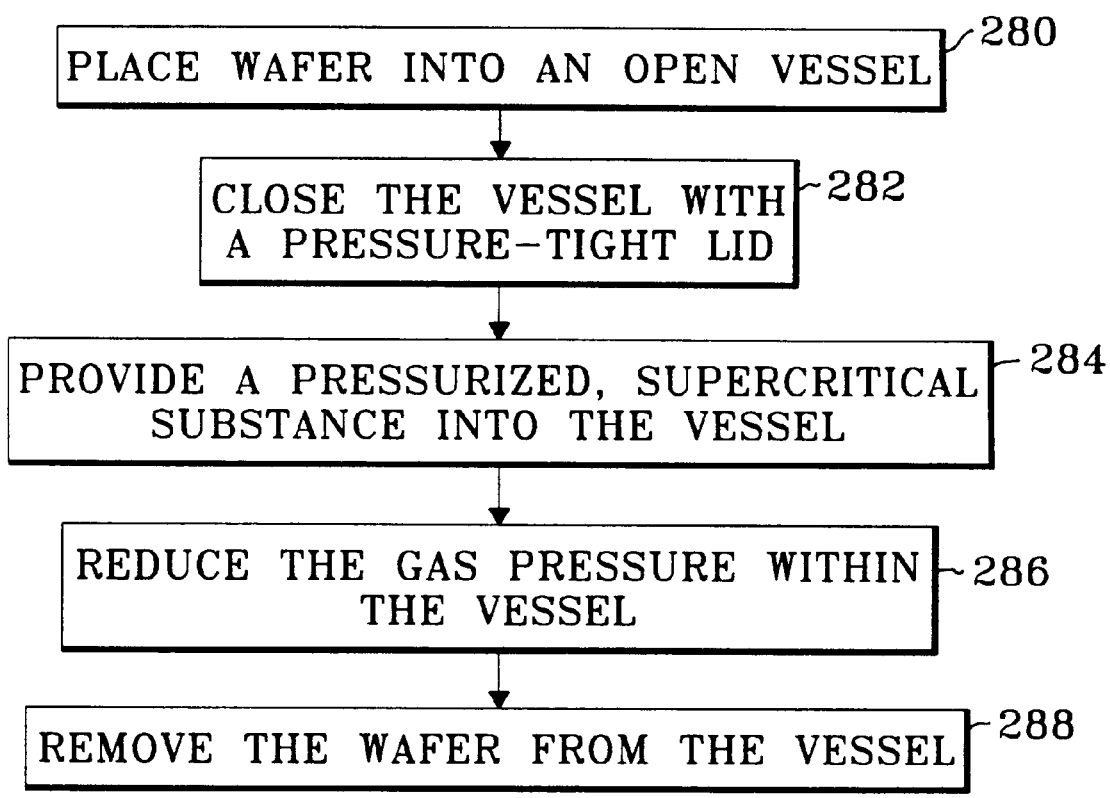
FIG. 6 is a diagram illustrating the processing steps of a supercritical wafer processing method of the present invention.

FIG. 6 illustrates the basic steps of a high pressure semiconductor wafer processing method, specifically including the providing of a supercritical substance within the vessel. A wafer is placed into an open vessel, as represented in step 280. The vessel containing the wafer is closed with a pressure-tight lid, as represented in step 282. Next, a supercritical substance such as carbon dioxide, argon, trifluoromethane, or fluoromethane is provided within the vessel, as represented in step 284. A substance in supercritical phase is neither a gas nor a liquid, but exhibits properties somewhat akin to both gas and liquid, having high exchange rates and enhanced cleaning capabilities. While the supercritical point varies by substance, it generally is obtained at high temperatures and pressures. Accordingly, the provision of a supercritical substance within the vessel may be accomplished by delivering a substance already in supercritical phase into the vessel, or by heating and/or pressurizing the substance within the vessel until it reaches supercritical phase. Optionally, the substance may be cycled through the supercritical point within the vessel, and thereby through liquid-gas phase changes, to obtain dramatically improved penetration into small wafer geometries and features, such as deep and narrow vias, by essentially flash evaporating the supercritical substance out of these geometries. As represented in step 286, the pressure within the vessel may be reduced to ambient condition after one or more cycles, such as by reducing the pressurized supply to the vessel, and finally the vessel may be opened to permit the wafer to be removed, as represented in step 288.

FIGS. 7A and 7B illustrate a wafer processing system 299, wherein wafers 300 are contained within a vessel 302 having a front wall 310, a rear wall 312, side walls 314, 316, a bottom wall 318, a hinged lid 304. The lid 304 pivots open with a hinge 306 to allow the wafers 300 to be inserted into and removed from the vessel 302. A liquid supply orifice 320, preferably mounted along or adjacent to the bottom wall of the vessel, provides a location for liquid 322 to be supplied into the vessel 302. Preferably, various chemical mixtures and rinsing liquids may be supplied to the vessel 302 through the liquid supply orifice 320 and directed by external piping.

Liquid 322 supplied to the vessel 302 preferably immerses the wafers 300 completely. When rinsing liquid is used, it continues to overflow the vessel 302 so as to flush away any loose contaminants within the vessel 302 or along the surfaces of the wafers 300. The front wall 310 of the vessel 302 is shorter than the rear wall 312 to permit, when the hinged lid is open, liquid to overflow the front wall 310 into the overflow basin 330. Overflow liquid 331 is removed from the basin 330 by a drain port 332. Limiting the height of the liquid 322 within the vessel 302 also prevents liquid 322 from contacting the gas delivery orifice 308 located in the lid 304, so as to avoid problems with bubbling and liquid carryover in case drying will be performed within the vessel 302. The lid 304 further has a protruding front wall portion 305 to mate with the reduced-height front wall 310. After liquid 322 has been delivered to the vessel 302, pressurized gas 324 may be supplied into and pressurize the vessel 302 through the gas delivery orifice 308.

Within the vessel 302, the wafers 300 are elevated by a pedestal 340 relative to the bottom wall 318. Elevating the wafer allows the liquid 322 within the vessel 302 to be drained to a level below the wafers 300 before the wafers 300 are extracted from the vessel. The wafers 300 are supported from above and below by longitudinal combs 342, which are linked by detachable comb links 344 to maintain the position of the wafers 300 within the vessel 302. A plurality of wafers may be processed simultaneously within a suitably configured vessel.

A floating drain ring 350 surrounds the wafers 300 within the vessel 302. The floating drain ring 350 floats atop the liquid 322 within the vessel 302. The vessel 302 is illustrated as being approximately half full of liquid 322, with the drain ring 320 floating along the liquid surface 323. Because it floats, the drain ring 350 moves vertically with the liquid level 323 inside the vessel 302. The drain ring 350 has a plurality of orifices or slots 352 along the underside 355 of the ring 350 to drain liquid 322 from the vessel 302. It is important to drain the vessel 302 just below the liquid surface 323 so as to constantly drain away the surface layer of liquid 322, thereby maintaining the surface tension gradient along the gas-liquid interface, and also preventing the gas 324 from escaping directly before dissolving into surface of the liquid 322 within the vessel 302. To similarly promote constant and even draining away of the surface layer of liquid 322, it is preferred to have the drain ring 350 extend completely around the wafers 350.

Liquid 322 is drained from the vessel 302 through the drain ring 350 and into the liquid outlet 356 via flexible tubing 354. Flow through the drain ring 350, flexible tubing 354, and the vessel liquid outlet 356 is modulated by an external throttling valve (not shown). The motive force for this flow is the elevated pressure within the vessel 302, and gas 324 preferably continues to flow into the vessel 302 through gas supply orifice 308 while the liquid 322 is being drained. Because the flow is driven by a difference in pressure, rather than mere gravity, the liquid outlet 356 need not be positioned below the drain ring 350 at all times. This permits the liquid outlet 356 to be positioned along the midpoint of the front wall 310 so as to minimize the length of the flexible tubing 354. The flow rate must be adequate to create a reasonable drain rate, although one to ten liters per minute at an operating pressure is a preferred flow rate for a vessel approximately forty liters in size.

The elevated pressure within the vessel causes gas 324 to dissolve into the liquid 322 along the gas-liquid interface 323, thus generating a surface tension gradient along the liquid surface. As the liquid 322 is being drained, the gas-liquid interface 323 descends within the vessel 302, and the wafers 300 are dried as the surface tension gradient pulls the liquid from the surfaces of the wafers 300 as the wafers 300 are exposed to the gas 324. This draining continues until the liquid level 323 drops completely below the dried wafers 300. When processing or drying is completed, the pressure may be reduced within the vessel 302 by reducing the pressurized gas supply, and the vessel 302 may be opened to permit removal of the wafers 300. Any residual liquid 322 within the vessel 302 at the time the pressure is reduced may be drained through a gravity drain orifice 358 along the bottom of the vessel 302.

The vessel 302 preferably operates at a pressure between 10 and 100 atmospheres, more preferably between 20 and 50 atmospheres. The vessel 302 should be constructed of a structural material such as stainless steel that is suitably strong to contain these elevated pressures, even under cycling pressure loads, with a margin for safety. Since various liquids and gases may be used within the vessel, the surfaces of the vessel 302 contacting liquid or gas should be coated with a non-reactive substance such as a polymer, like polytetrafluoroethylene, or a quartz material. The vessel 302 may further incorporate temperature control, such as with external heat exchangers, and megasonic transducers to provide a wide range of processing options.

FIGS. 8A and 8B illustrate an alternative wafer processing system 399 similar to the system 299 described in FIGS. 7A and 7B, but with the following differences. As shown in FIGS. 8A and 8B, 15 wafers 400 are contained within a tank 402 that is completely contained within a pressurized vessel 401. The tank 402 is illustrated as being filled with liquid 422. If the tank 402 is overflowed, then any excess liquid flows into the surrounding vessel 401 where it can be drained through a gravity drain orifice 458 at the bottom of the vessel 401. Accordingly, there is no need for an overflow basin in apparatus 399, since overflows are contained by the vessel 401. Positioning the tank 402 within the vessel 401 simplifies locating the gas delivery orifice 408 to deliver gas to the vessel 401 at a location not in contact with liquid. The gas delivery orifice 408 is not positioned along the hinged lid 404 of the vessel 401, but rather along one stationary side 411 of the vessel. Also, since the tank 402 experiences equal pressures along all sides 410, 412, and 418, the use of structural materials directly underlying surfaces contacting liquids and gases used for wafer processing is obviated. The system 399 otherwise operates the same as the system 299 shown in FIGS. 7A and 7B. A liquid supply orifice 420, preferably mounted along or adjacent to the bottom wall 418 of the tank 402, provides a location for liquid 422 to be supplied into the vessel tank 402. Within the tank 402, the wafers 400 are elevated by a pedestal 440 relative to the bottom wall 418 of the tank. Surrounding the wafers 400 within the tank 400 is a floating drain ring 450 that floats atop the liquid 422 within the tank 402. The drain ring 450 has a plurality of orifices or slots 452 along the underside 455 of the ring 450 to drain water 422 from the tank 402 just below the gas-liquid interface 423. Liquid 422 is drained through the drain ring 450 and into the liquid outlet orifice 456 from the tank via flexible tubing 454. The vessel 401 preferably operates at a pressure between 10 and 100 atmospheres, more preferably between 20 and 50 atmospheres. As the liquid 422 is being drained, the gas-liquid interface 423 descends within the tank 402, and the wafers 400 are dried as the surface tension gradient pulls the liquid from the surfaces of the wafers 400. This draining continues until the liquid level 423 drops completely below the dried wafers 400.

When processing or drying is completed, the pressure may be reduced within the vessel 402 by reducing the pressurized gas supply, and the vessel 402 may be opened to permit removal of the wafers 400. After the pressure has been reduced, any residual liquid 422 within the tank may be drained through a gravity drain orifice 420 along the bottom of the tank.

Figure 9B:
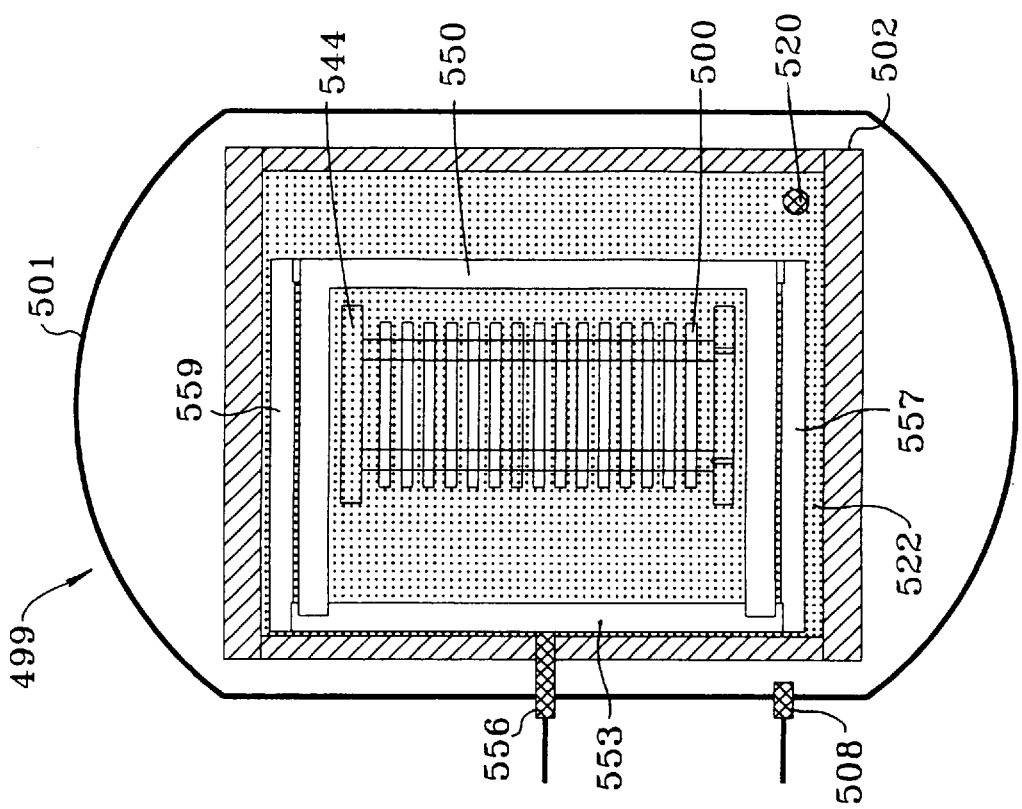
FIG. 9B is a schematic, cross-sectional, plan view of the apparatus of FIG. 9A along section line "C—C" in FIG. 9A.
Figure 9A:
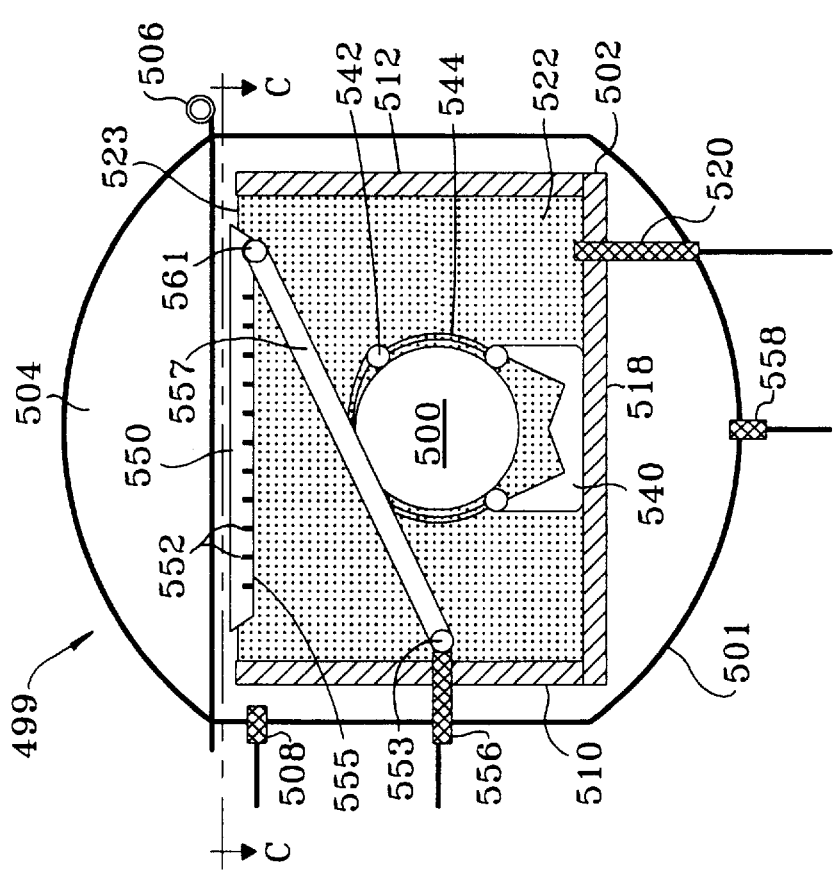
FIG. 9A is a schematic, cross-sectional, side view of a second alternative wafer processing apparatus of the present invention.

FIGS. 9A and 9B illustrate a second alternative wafer processing system 499 of the present invention. The system 499 is the same as the system 399 shown in FIGS. 8A and 8B, except for differences relating to draining from the tank 502. In particular, the system 499 does not have a drain ring that surrounds the wafers 500 on all sides. Rather it has a drain bar 550 having three sides. Rather than draining liquid from the tank 502 into the liquid outlet orifice via flexible tubing, the drain bar 550 connects to the liquid outlet 556 via rigid, hollow pivotal links 557, 559 and a hollow drain crossbar 553. Thus, the drain bar 550 is hinged inside one wall 510 of the tank, and the drain bar 550 follows an arcuate path as it ascends or descends in response to changing water level within the tank. A plurality of orifices 552 along the underside of the drain bar 550 draw water from within the tank 502 just below the gas-liquid interface 423. When draining begins, liquid 522 is drawn through orifices 552 and into the drain bar 550. From the drain bar, the liquid 522 is travels through the hollow pivotal links 557, 559 into the hollow drain crossbar 553 and finally into the liquid outlet orifice 556 to exit the tank and vessel.

A liquid supply orifice 520, preferably mounted along or adjacent to the bottom wall 518 of the tank 502, provides a location for liquid 522 to be supplied into the tank 502 containing one or more wafers 500. Preferably, the liquid 522 immerses the wafers 500. Within the tank 502, the wafers 500 are elevated by a pedestal 540 relative to the bottom wall 518 of the tank 502. The vessel 501 preferably operates at a pressure between 10 and 100 atmospheres, more preferably between 20 and 50 atmospheres.

As the liquid 522 is being drained, the gas-liquid interface 523 descends within the tank 502, and the wafers 500 are dried due to the surface tension gradient created by high pressure gas dissolved into the liquid 522. The surface tension gradient at the gas-liquid interface pulls the liquid off of the wafers 500. The drain bar 550 maintains this surface tension gradient by removing a top layer of the liquid 522 within the tank 502, so that fresh liquid can continuously come into contact with the high pressure gas delivered into the vessel 501.

The draining continues until the liquid level 523 drops completely below the dried wafers 500. When processing or drying is completed, the pressure may be reduced within the vessel 502 by reducing the pressurized gas supply, and the vessel 502 may be opened to permit removal of the wafers 500. After the pressure has been reduced, any residual liquid 522 within the tank may be drained through a gravity drain orifice 520 along the bottom of the tank.

Although floating drains have been described, a non-floating drain, moved with an actuator, can also be used.

The systems described above provide the advantage that the wafers need not be moved during processing. This eliminates mechanical sources of contamination. In-situ rinsing and drying may be performed. The use of high pressure provides additional processing options. Boiling points are suppressed. Higher processing temperatures can be used. Processing performance of various process chemistries is improved. Drying can be achieved without using organic vapors, such as alcohols, thereby avoiding the disadvantages associated with such organic vapors. The solubility of gases in the liquids is increased. Cavitation and bubble formation are reduced, allowing for more effective use of megasonics to enhance cleaning. Reagent penetration into small geometries is improved.

Though the present invention has been described in terms of certain preferred embodiments, other embodiments apparent to those skilled in the art should also be considered as within the scope of the present invention. Elements and steps of one embodiment may also readily be used in other embodiments. Substitutions of steps, devices, and materials, will be apparent to those skilled in the art, and should be considered still to be within the spirit of the invention. Accordingly, the invention should not be limited, except by the following claims, and their equivalents.

What is claimed is:

1. A method for processing a wafer, comprising the steps of:
   placing the wafer into a vessel;
   delivering a liquid into the vessel, creating a liquid level;
   sealing the vessel so that it is pressure-tight;
   delivering a pressurized gas into the vessel;
   transmitting sonic energy to the wafer;
   draining the liquid from the vessel;
   reducing the gas pressure within the vessel; and
   removing the wafer from the vessel.

2. The method of claim 1, wherein the pressurized gas is delivered into the vessel at a location above the surface of the liquid.

3. The method of claim 1, wherein the delivery of the liquid into the vessel continues until the liquid overflows at least one side of the vessel before the vessel is closed with the pressure-tight closing member.

4. The method of claim 1, wherein the delivery of pressurized gas continues while the liquid is drained from the vessel.

5. The method of claim 1, wherein the vessel is sealed with a pressure-tight closing member having an orifice, and the pressurized gas is delivered through the orifice in the closing member.

6. The method of claim 1, wherein the pressurized gas is inert and not insoluble in water.

7. The method of claim 1, wherein the pressurized gas is selected from the group consisting of carbon dioxide, argon, trifluoromethane, and fluoromethane.

8. The method of claim 1, wherein the delivery of pressurized gas into the vessel pressurizes the vessel to a pressure between 10 and 100 atmospheres.

9. The method of claim 1, wherein the delivery of pressurized gas into the vessel pressurizes the vessel to a pressure between 20 and 50 atmospheres.

10. The method of claim 1 wherein the liquid is drained from a location just below the liquid surface.

11. The method of claim 1 further comprising the steps of controlling the temperature of the gas.

12. The method of claim 1 further comprising the steps of controlling the temperature of the liquid.

13. The method of claim 1 further comprising the steps of controlling the temperature of the vessel.

14. The method of claim 1, wherein:
   the liquid is pressurized before being delivered to the vessel; and
   the vessel is closed with a pressure-tight closing member before the liquid is delivered into the vessel.

15. The method of claim 1 further comprising the step of stopping the delivery of pressurized gas into the vessel before draining any liquid from the vessel.

16. The method of claim 1 further comprising the steps of stopping delivery of pressurized gas into the vessel before all liquid is drained from the vessel.

17. A method for processing a wafer, comprising the steps of:
   placing the wafer into a tank within a vessel;
   delivering a liquid into the tank, creating a liquid level within the tank;
   closing the vessel with a pressure-tight closing member;
   delivering a pressurized gas into the vessel at a location above the liquid level;
   transmitting sonic energy into the liquid;
   draining the liquid from the tank;
   reducing the gas pressure within the vessel; and
   removing the wafer from the tank.

18. The method of claim 17, wherein the delivery of the liquid into the tank continues until the liquid overflows at least one side of the tank.

19. The method of claim 17, wherein the delivery of pressurized gas continues while the liquid is drained from the vessel.

20. The method of claim 17, wherein the pressurized gas is selected from the group consisting of carbon dioxide, argon, trifluoromethane, and fluoromethane.

21. The method of claim 17, wherein the delivery of pressurized gas into the vessel pressurizes the vessel to a pressure between 10 and 100 atmospheres.

22. The method of claim 21, wherein the pressurized gas is delivered into the vessel at a rate between approximately 1 and 10 liters per minute.

23. The method of claim 17, wherein the delivery of pressurized gas into the vessel pressurizes the vessel to a pressure between 20 and 50 atmospheres.

24. The method of claim 17 further comprising the steps of controlling the temperature of the gas.

25. The method of claim 17 further comprising the steps of controlling the temperature of the liquid.

26. The method of claim 17 further comprising the steps of controlling the temperature of the vessel.

27. The method of claim 17, wherein:
   the liquid is pressurized before being delivered to the vessel; and
   the vessel is closed with a pressure-tight closing member before the liquid is delivered into the vessel.

28. A method for processing a wafer, comprising the steps of:
   placing the wafer into a vessel;
   making the vessel pressure-tight;
   providing a pressurized, supercritical substance within the vessel;
   transmitting sonic energy to the wafer;
   reducing the pressure within the vessel; and
   removing the wafer from the vessel.

29. The method of claim 28, wherein the supercritical substance is selected from the group consisting of carbon dioxide, argon, trifluoromethane, and fluoromethane.

30. The method of claim 28 further comprising the step of controlling the temperature of the vessel.

31. The method of claim 30 further comprising the steps of:
   delivering the substance into the vessel in a pressurized but sub-critical phase, and transitioning the pressurized substance from sub-critical to supercritical phase by heating the vessel.

32. The method of claim 28, wherein the supercritical substance is supercritical upon delivery to the vessel.

33. The method of claim 28, wherein:

the reduction of pressure within the vessel is reduced to a level below the critical point of the substance; and the steps of providing the supercritical substance within the vessel and reducing the pressure to below the critical point of the substance are repeated at least once before the wafer is removed from the vessel.

34. A method for processing a wafer comprising the steps of:

placing the wafer into a vessel;

closing the vessel with a pressure-tight closing member;

delivering a liquid into the vessel until the wafer is immersed in liquid and the liquid level is above the wafer;

delivering a pressurized gas into the vessel;

transmitting sonic energy into the liquid;

draining the liquid from the vessel until the liquid level is below the wafer;

reducing the pressure within the vessel; and removing the wafer from the vessel.

35. The method of claim 34, wherein the pressurized gas is delivered into the vessel while the wafer is immersed in liquid and the liquid is drained from the vessel.

36. The method of claim 34, wherein the steps of immersing the wafer in liquid and draining the liquid from the vessel until the liquid level is below the wafer are repeated at least once.

37. The method of claim 34 further comprising the step of heating the vessel.

38. The method of claim 34, further comprising the step of heating the wafers to a temperature greater than 100 degrees C.

39. The method of claim 34, wherein the vessel is pressurized between 10 and 100 atmospheres.

40. The method of claim 34, wherein the vessel is pressurized between 20 and 50 atmospheres.

41. The method of claim 34, wherein the pressurized gas comprises ozone.

42. The method of claim 34, wherein the liquid is drained at a location just sufficiently below the liquid surface to prevent gas from escaping out of the vessel.

43. The method of claim 34, wherein the gas is delivered into the vessel at a location above the liquid surface.

44. The method of claim 34, wherein the gas is delivered into the vessel at a location below the liquid surface.

45. The method of claim 34 further comprising the step of controlling the temperature of the vessel.

46. An apparatus for processing an article comprising:

a pressure vessel having at least one side, a bottom, a sealable closing member suitable for containing elevated pressures within the vessel, a liquid supply orifice, and a gas supply orifice;

a liquid supply valve suitable for delivering liquid through the liquid supply orifice to create a liquid level within the vessel, a gas supply valve for delivering pressurized gas into the vessel at a location above the liquid level;

a sonic transducer on the vessel for transmitting sonic energy into the liquid;

an article support in the vessel; and a movable liquid drain within the vessel.

47. The apparatus of claim 46 further comprising a throttle valve for controlling flow through the movable liquid drain.

48. The apparatus of claim 48, wherein the liquid drain floats on the liquid within the vessel.

49. An apparatus for processing a workpiece comprising:

a vessel having a gas supply orifice and a sealable lid suitable for containing elevated pressures within the vessel;

a tank within the vessel, the tank having at least one side, a bottom, and a liquid supply orifice;

a liquid supply valve suitable for delivering liquid through the liquid supply orifice to create a liquid level within the tank;

a gas supply valve for delivering pressurized gas into the vessel at a location above the liquid level;

a sonic transducer on or in the vessel;

a support in the tank for supporting at least one workpiece; and a vertically displaceable liquid drain within the tank to extract liquid at a depth just below the liquid level within the tank.

50. The apparatus of claim 49, wherein the liquid draining member floats on the liquid within the vessel.

51. The apparatus of claim 49, wherein the vessel contains multiple chambers, with the wafer being placed in a first chamber and liquids being pressurized in a second chamber for subsequent delivery into the first chamber.

52. The apparatus of claim 51, wherein a valve is installed between the first chamber and the second chamber.

53. The apparatus of claim 51 further including a pressure bladder in the second chamber.

* * * * *